(12) United States Patent
Kashihara

(10) Patent No.: US 7,109,687 B2
(45) Date of Patent: Sep. 19, 2006

(54) THREE-PHASE AC GENERATOR FOR VEHICLE

(75) Inventor: Toshiaki Kashihara, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 111 days.

(21) Appl. No.: 10/500,582

(22) PCT Filed: Nov. 11, 2002

(86) PCT No.: PCT/JP02/11727

§ 371 (c)(1),
(2), (4) Date: Jul. 1, 2004

(87) PCT Pub. No.: WO2004/045050

PCT Pub. Date: May 27, 2004

(65) Prior Publication Data

US 2005/0082930 A1    Apr. 21, 2005

(51) Int. Cl.
| | |
|---|---|
| H02H 7/06 | (2006.01) |
| H02P 9/00 | (2006.01) |
| H02P 11/00 | (2006.01) |
| H02K 11/00 | (2006.01) |
| H02K 11/04 | (2006.01) |

(52) U.S. Cl. .................. 322/24; 322/28; 310/68 D
(58) Field of Classification Search ............. 322/24, 322/26, 28, 38, 46; 290/52; 310/68 D, 179
See application file for complete search history.

(56) References Cited

U.S. PATENT DOCUMENTS

| | | | | |
|---|---|---|---|---|
| 2,637,014 A | * | 4/1953 | Stallard | 322/32 |
| 3,205,429 A | * | 9/1965 | Robinson | 322/28 |
| 3,544,883 A | * | 12/1970 | Milne | 323/201 |
| 3,641,374 A | * | 2/1972 | Sato | 310/68 D |
| 4,128,799 A | * | 12/1978 | Morishima | 322/28 |
| 5,682,070 A | * | 10/1997 | Adachi et al. | 310/71 |
| 6,034,511 A | * | 3/2000 | Scott et al. | 322/46 |
| 6,359,352 B1 | * | 3/2002 | Asao | 310/68 D |
| 6,407,476 B1 | * | 6/2002 | Nishimura | 310/180 |
| 6,879,053 B1 | * | 4/2005 | Welches et al. | 290/6 |
| 2005/0237034 A1 | * | 10/2005 | Patterson | 322/46 |

FOREIGN PATENT DOCUMENTS

| | | |
|---|---|---|
| JP | 57-6358 A | 6/1955 |
| JP | 09-019119 A | 1/1997 |
| JP | 11-041886 A | 2/1999 |
| JP | 2000-350426 A | 12/2000 |
| JP | 2001-352715 A | 12/2001 |
| JP | 2002-112491 A | 4/2002 |

* cited by examiner

Primary Examiner—Julio C. Gonzalez
(74) Attorney, Agent, or Firm—Sughrue Mion, PLLC

(57) ABSTRACT

A neutral point diode having three connecting terminals electrically commonly connected to each other is used in a type for connecting each generating coil of a three-phase alternating current electric generator for a vehicle in a Y-shape connection. The coil terminal of a neutral point side of each generating coil is connected to each of the three connecting terminals of this neutral point diode. A diode having two connecting terminals electrically commonly connected to each other is used in a type for connecting each generating coil in a Δ-shape connection. The coil terminals of two adjacent generating coils are connected to the respective two connecting terminals of this diode. In both the types, one coil terminal is connected to one connecting terminal and a connecting work is simplified.

4 Claims, 11 Drawing Sheets

THREE-PHASE AC GENERATOR FOR VEHICLE

TECHNICAL FIELD

This invention relates to a three-phase alternating current electric generator for a vehicle mounted to the vehicle and used to charge a battery mounted to the vehicle and supply electricity to other electric loads for the vehicle, and particularly relates to a three-phase alternating current electric generator for a vehicle building-in a rectifier assembly for rectifying an alternating current output of each of generating coils of the three phases.

BACKGROUND ART

A Y-shape connection for connecting the respective generating coils of the three phases in a star shape (Y-shape), and a Δ-shape connection for connecting the respective generating coils of the three phases in a delta shape (Δ-shape) are known as the three-phase alternating current electric generator for a vehicle building-in the rectifier assembly of this kind.

First, the three-phase alternating current electric generator for a vehicle of the conventional Y-shape connection will be explained. The three-phase alternating current electric generator of a neutral output utilization type for rectifying a neutral output of each of the generating coils of the three phases and further increasing the rectifying output is known as the three-phase alternating current electric generator for a vehicle of the Y-shape connection. For example, the three-phase alternating current electric generator for a vehicle of this neutral output utilization type is disclosed in FIG. 7 of JP-A-9-19119.

In the three-phase alternating current electric generator for a vehicle of the neutral output utilization type of this kind, it is necessary to connect a coil terminal of the neutral side of each of the generating coils of the three phases connected in the Y-shape connection to a neutral diode of the rectifier assembly built in the electric generator. Each of the generating coils of the three phases has the three coil terminals on the neutral side in total. In the three-phase alternating current electric generator of the neutral output utilization type, it is necessary to connect all these three coil terminals of the neutral side to one neutral diode.

In the construction for connecting the three coil terminals of the neutral side to one diode, all the three coil terminals are connected to one connecting terminal of the diode as a result so that it is difficult to make its connecting work.

For example, in a full-wave rectifier assembly, a diode pair connected to the neutral point is constructed by a positive side diode and a negative side diode, and an anode terminal of the positive side diode and a cathode terminal of the negative side diode are overlapped with each other. However, it is necessary to nip all the three coil terminals of the neutral side terminals from each generating coil in a portion in which these anode terminal and cathode terminal are overlapped with each other and are fastened. It is difficult to make such a connecting work.

JP-A-9-19119 discloses a three-phase alternating current electric generator for a vehicle in which the connecting structure of each of the generating coils of the three phases and the rectifier assembly is improved. In this prior art, the use of a special circuit substrate shown in the upper portion of FIG. 1 of this prior art is proposed. In this circuit substrate, a circuit pattern is formed on one surface of an insulating property substrate. The three coil terminals of the neutral side from each generating coil are connected to each other by the circuit pattern. Accordingly, as a result, the diode pair connected to the neutral point is constructed such that one terminal connected to the above circuit pattern is simply nipped between the anode and cathode terminals of this diode pair. Accordingly, its connecting work is simplified.

However, in accordance with this prior art, it is necessary to newly arrange the special circuit substrate between the generating coils of the three phases and the rectifier. This circuit substrate causes an increase in the number of parts built in the electric generator and makes the internal arrangement of a bracket complicated.

The three-phase alternating current electric generator for a vehicle of the conventional Δ-shape connection will next be explained. For example, this conventional three-phase alternating current electric generator for a vehicle of this Δ-shape connecting type is disclosed in FIG. 1 of JP-A-4-42759.

In this three-phase alternating current electric generator of the Δ-shape connection, it is necessary to connect two coil terminals from two adjacent generating coils among the respective generating coils of the three phases to each corresponding diode pair of the full-wave rectifier assembly built in the electric generator. In each diode pair, for example, it is necessary to fasten terminals from the two adjacent generating coils together with the anode terminal of the positive side diode and the cathode side terminal of the negative side diode. Accordingly, it is also difficult to make this connection.

This difficulty can be improved by using a circuit substrate shown in FIG. 1 of JP-A-9-19119. However, the number of parts is increased and the internal structure of the bracket is complicated by using the circuit substrate.

This invention proposes an improved three-phase alternating current electric generator for a vehicle able to simplify the connecting work of the generating coils of the three phases and the diode without increasing the special circuit substrate.

DISCLOSURE OF THE INVENTION

The three-phase alternating current electric generator for a vehicle in this invention is a three-phase alternating current electric generator for a vehicle includes an A-phase generating coil, a B-phase generating coil and a C-phase generating coil, and a rectifier assembly. The A-phase, B-phase and C-phase generating coils are connected in Y-shape connection. The rectifier assembly rectifies alternating current outputs of the A-phase, B-phase and C-phase generating coils.

In the three-phase alternating electric current generator, each of the A-phase, B-phase and C-phase generating coils has a non neutral side coil terminal and a neutral side coil terminal. The rectifier assembly has a neutral diode for making neutral point connection, and the neutral diode has a first, second and third connecting terminals commonly connected to each other. The neutral side coil terminal of the A-phase generating coil is connected to the first connecting terminal, and the neutral side coil terminal of the B-phase generating coil is connected to the second connecting terminal, and the neutral side coil terminal of the C-phase generating coil is connected to the third connecting terminal.

The neutral diode having the first, second and third connecting terminals commonly connected to each other is used in the three-phase alternating current electric generator for a vehicle in this invention. The coil terminals of the neutral side of the A-phase, B-phase and C-phase generating coils of the three phases are respectively connected to the first, second and third connecting terminals of the above neutral diode. The connecting work of the neutral diode and the coil terminal of the neutral side of each generating coil is simplified. The coil terminals of the neutral side of the generating coils of the three phases are respectively connected to the first, second and third connecting terminals of the neutral diode one by one, and the connecting work is simplified. Further, since no special circuit substrate is used, the internal construction of the electric generator can be simplified.

Further, the three-phase alternating current electric generator for a vehicle in this invention is an another three-phase alternating current electric generator for a vehicle includes an A-phase, B-phase and C-phase generating coils and a rectifier assembly. The A-phase, B-phase and C-phase generating coils are connected in Δ-shape connection, and each of the A-phase, B-phase and C-phase generating coils has a first coil terminal and a second coil terminal. The rectifier assembly rectifiers alternating current outputs of the A-phase, B-phase and C-phase generating coils, and the rectifier assembly has a first, second and third diode pairs.

In the another three-phase alternating current electric generator, each of the first, second and third diode pairs has first and second connecting terminals commonly connected to each other. The second coil terminal of the A-phase generating coil is connected to the first connecting terminal of the first diode pair, and the first coil terminal of the B-phase generating coil is connected to the second connecting terminal of the second diode pair and the second coil terminal of the B-phase generating coil is connected to the second connecting terminal of the second diode pair. The first coil terminal of the C-phase generating coil is connected to the second connecting terminal of the second diode pair, and the second coil terminal of the C-phase generating coil is connected to the first connecting terminal of the third diode pair and the first coil terminal of the A-phase generating coil is connected to the second connecting terminal of the third diode pair.

In the another three-phase alternating current electric generator for a vehicle in this invention, the rectifier assembly has the first, second and third diode pairs. Each of these diode pairs has the first and second connecting terminals commonly connected to each other. The coil terminal of the generating coil of each phase is connected to the first and second connecting terminals of the first, second and third diode pairs. As a result, the connecting work of each generating coil and each diode pair is simplified. The first and second coil terminals of the generating coil of each phase are respectively connected to the connecting terminals of each diode pair one by one, and the connecting work is simplified. Further, since no special circuit substrate is used, the internal construction of the electric generator can be simplified.

BEST MODE FOR CARRYING OUT THE INVENTION

Explanation of First Embodiment

Figure 1:
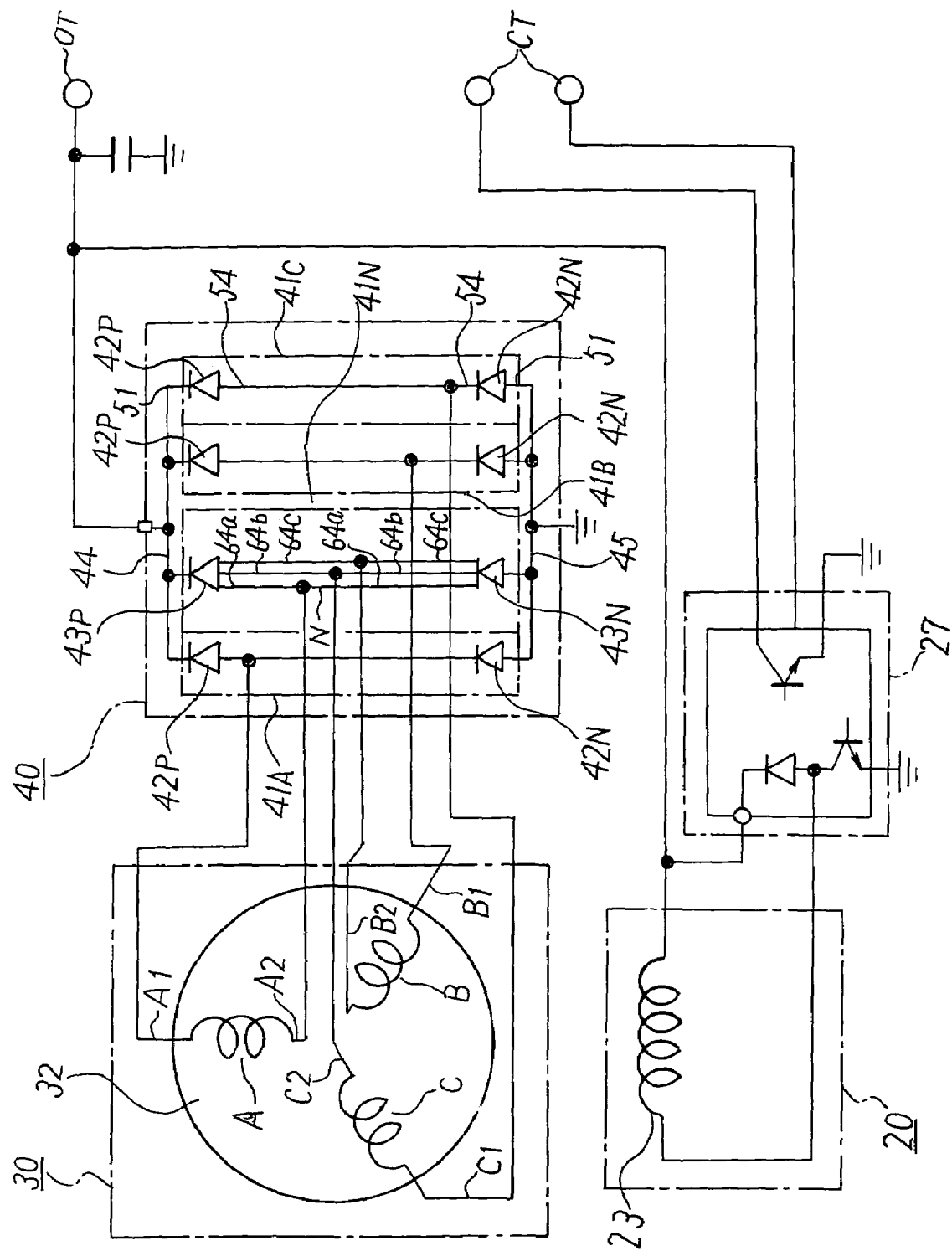
FIG. 1 is an electric circuit diagram showing a first embodiment of a three-phase alternating current electric generator for a vehicle in this invention.
Figure 2:
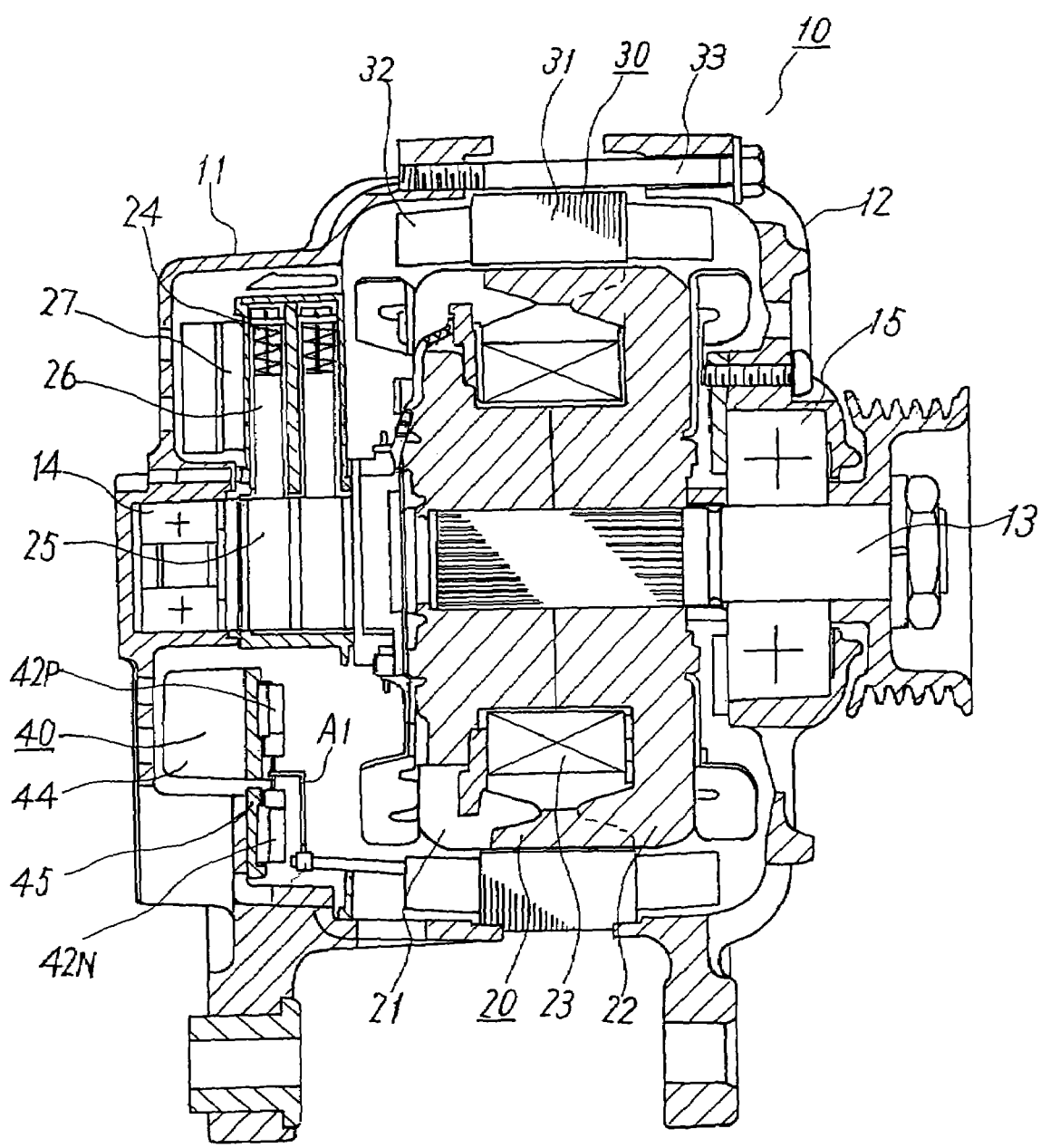
FIG. 2 is a cross-sectional view showing the three-phase alternating current electric generator for a vehicle in the first embodiment.

FIG. 1 is an electric circuit diagram showing a first embodiment of a three-phase alternating current electric generator for a vehicle in this invention. FIG. 2 is a cross-sectional view showing the internal structure of this three-phase alternating current electric generator for a vehicle.

Entire Explanation of First Embodiment

The three-phase alternating current electric generator 10 for a vehicle shown in FIGS. 1 and 2 is a three-phase alternating current electric generator of a Y-shape connecting type. This three-phase alternating current electric generator 10 has a pair of brackets 11, 12, a rotating shaft 13, a rotor 20, a stator 30 and a rectifier 40. The rotating shaft 13 is rotatably supported by the pair of brackets 11, 12 through ball bearings 14, 15. This rotating shaft 13 is operated by an engine mounted to the vehicle, and the rotor 20 is fixed to this rotating shaft 13.

Explanation of Rotor 20 of First Embodiment

This rotor 20 is a rotating field magnet and has a pair of field magnet ion cores 21, 22 and a field magnet coil 23. The field magnet coil 23 is magnetized by an unillustrated battery mounted to the vehicle through an electricity supply mechanism 24. This electricity supply mechanism 24 has a pair of slip rings 25 arranged in the rotating shaft 13, and a pair of brushes 26 coming in contact with these slip rings 25. A field electric current supplied to the field magnet coil 23 is adjusted by a voltage adjuster 27, and the output voltage of the electric generator is adjusted on the basis of the adjustment of this field magnet electric current. One end of the field magnet coil 23 is connected to an output terminal OT of the electric generator, and the other end is connected to a common electric potential point (earth) through the voltage adjuster 27. The voltage adjuster 27 receives a control signal from a control terminal CT. The brush 26 and the voltage adjuster 27 are arranged within one bracket 11.

Explanation of Stator 30 of First Embodiment

The stator 30 is arranged around the rotor 20. This stator 30 is an armature and has an armature iron core 31 and an armature coil 32. The armature iron core 31 is nipped and supported by a fastening bolt 33 between the pair of brackets 11, 12. The armature coil 32 has generating coils A, B, C of the respective three phases. These electricity generating coils A, B, C are formed such that both coil terminals of each generating coil are respectively independent. These generating coils A, B, C respectively have coil terminals A1, B1, C1 of the non-neutral side and coil terminals A2, B2, C2 of the neutral side. In the first embodiment shown in FIGS. 1 and 2, the coil terminals A2, B2, C2 of the neutral side of these generating coils A, B, C are connected to each other in the Y-shape connection at a neutral point N, but the line connection at this neutral point N is made by the rectifier assembly 40.

Entire Explanation of Rectifier Assembly 40 of First Embodiment

The rectifier assembly 40 is arranged in the inner circumference of the bracket 11 together with the brush 26 of the electricity supply mechanism 24. This rectifier assembly 40 is a three-phase full-wave rectifier. This three-phase full-wave rectifier assembly 40 is constructed so as to connect the generating coils A, B, C in the Y-shape connection and full-wave-rectify these outputs and also full-wave-rectify an alternating current output from the neutral point N in order to further increase the output of the electric generator.

This rectifier assembly 40 has four diode pairs 41A, 41B, 41C, 41N. Each of the three diode pairs 41A, 41B, 41C is constructed by a diode 42P of the positive side and a diode 42N of the negative side. The diode pair 41N is a diode pair for making the neutral point connection, and is constructed by a neutral diode 43P of the positive side and a neutral diode 43N of the negative side.

The four diodes of the positive side, i.e., the three positive side diodes 42P and the neutral diode 43P of the positive side are respectively attached to a heat sink 44 of the positive side. This heat sink 44 of the positive side constitutes a positive side output terminal of the rectifier assembly 40, and is set to a positive side output terminal OT of the electric generator. Further, the three negative side diodes 42N and the neutral diode 43N of the negative side are respectively attached to a heat sink 45 of the negative side. This heat sink 45 of the negative side constitutes a negative side output terminal of the rectifier assembly 40, and this negative side output terminal is connected to a common electric potential point (earth). The heat sink 45 is directly attached to the inner face of the bracket 11. The heat sink 44 is located in the inner circumference of the heat sink 45 and is electrically insulated and attached to the bracket 11.

Explanation of Heat Sinks 44, 45 of Rectifier Assembly 40 of First Embodiment

Figure 3:
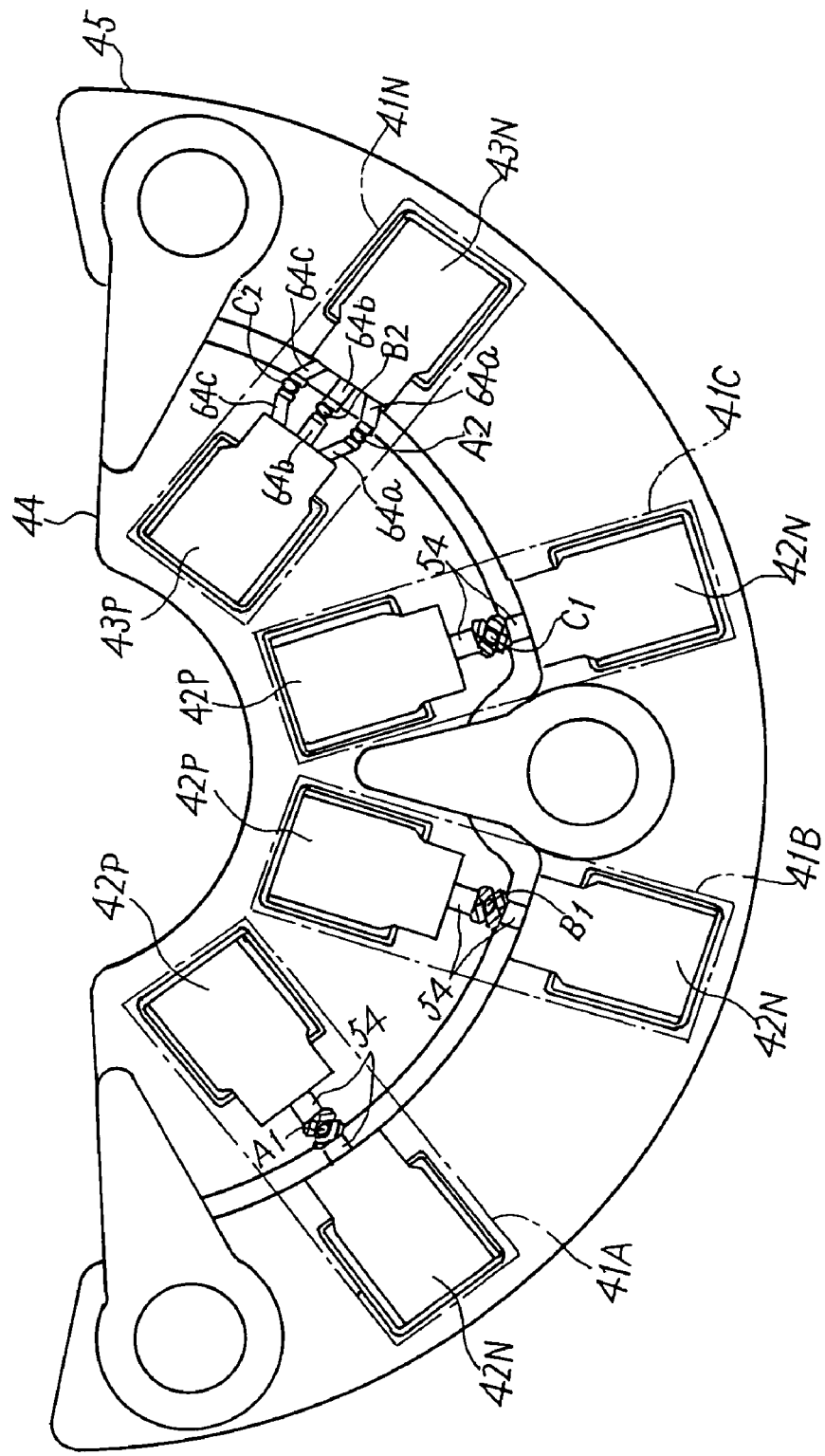
FIG. 3 is a front view showing a heat sink used in the first embodiment.

The heat sinks 44, 45 are shown in FIG. 3. Both these heat sinks 44, 45 have a horseshoe shape and the heat sink 44 is arranged in the inner circumference of the heat sink 45 as shown in FIG. 3. In the heat sink 44, the three positive side diodes 42P and the neutral diode 43P of the positive side are mutually arranged at an equal angle interval. Similarly, in the heat sink 45, the three negative side diodes 42N and the neutral diode 43N of the negative side are mutually arranged at an equal angle interval. The three positive side diodes 42P and the three negative side diodes 42N are opposed to each other in the radial direction so that the three diode pairs 41A, 41B, 41C are constructed. Similarly, the neutral diode 43P of the positive side and the neutral diode 43N of the negative side are opposed to each other in the radial direction so that the diode pair 41N connecting the neutral point N is constructed.

Figure 4:
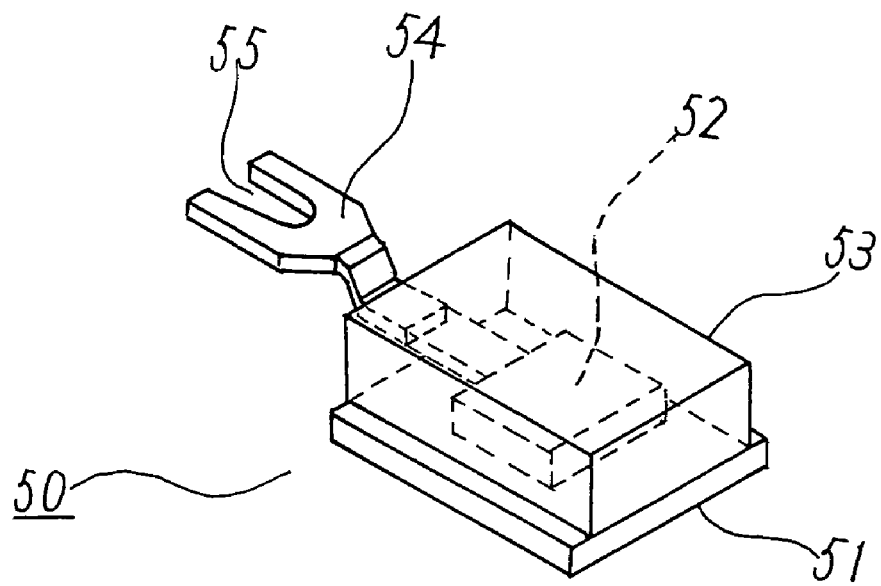
FIG. 4 is a perspective view showing a non-neutral diode used in the first embodiment.

Explanation of Diode Pairs 41A, 41B, 41C of Rectifier Assembly of First Embodiment The three positive side diodes 42P and the three negative side diodes 42N mutually have the same package structure 50. This package structure 50 is shown by a perspective view in FIG. 4. This package structure 50 has an electrically conductive substrate 51, a diode chip 52 brazed onto this electrically conductive substrate 51, a resin package 53 covering this diode chip 52, and a drawing-out terminal 54 drawn out from this resin package 53. The tip of this drawing-out terminal 54 is branched into two portions, and a groove 55 is formed between the two portions.

In the three positive side diodes 42P, the cathode electrode of the diode chip 52 is arranged so as to be joined to the electrically conductive substrate 51, and the drawing-out terminal 54 is connected to the anode electrode of the diode chip 52. As its result, in the positive side diodes 42P, the electrically conductive substrate 51 constitutes a cathode drawing-out terminal, and the drawing-out terminal 54 constitutes a nanode drawing-out terminal. In contrast to this, in the three negative side diodes 42N, the anode electrode of the diode chip 52 is arranged so as to be joined to the electrically conductive substrate 51, and the drawing-out terminal 54 is joined to the cathode electrode of the diode chip 52. As its result, in the negative side diodes 42N, the electrically conductive substrate 51 constitutes an anode drawing-out terminal, and the drawing-out terminal 54 constitutes a cathode drawing-out terminal. In the heat sink 44 shown in FIG. 3, the electrically conductive substrate 51 of each positive side diode 42P, i.e., the cathode drawing-out terminal is joined to the heat sink 44, and the anode drawing-out terminal 54 of each positive side diode 42P is extended toward the negative side diode 42N. Further, in the heat sink 45, the electrically conductive substrate 51 of each negative side diode 42N, i.e., the anode drawing-out terminal is joined to the heat sink 45, and the cathode drawing-out terminal 54 of each negative side diode 42N is extended toward the positive side diode 42P.

In each of the diode pairs 41A, 41B, 41C, the drawing-out terminal 54 of the positive side diode 42P is an anode side terminal, and the drawing-out terminal 54 of the negative side. diode 42N is a cathode side terminal. These drawing-out terminals 54, 54 are overlapped with each other, and the coil terminals A1, B1, C1 on the non-neutral point side of the respective generating coils A, B, C of the three phases are respectively nipped and brazed between the grooves 55 of these drawing-out terminals 54, 54.

Explanation of Neutral Diode Pair 41N of Rectifier Assembly 40 of First Embodiment The positive side diode 43P and the negative side diode 43N constituting the diode pair 41N for the neutral point connection mutually have the same package structure 60. This package structure 60 is shown by a perspective view in FIG. 5. This package structure 60 has an electrically conductive substrate 61, a diode chip 62 brazed onto this electrically conductive substrate 61, a resin package 63 covering this diode chip 62, and a drawing-out terminal 64 drawn out of this resin package 63. This drawing-out terminal 64 has first, second and third connecting terminals 64*a*, 64*b*, 64*c* parallel to each other in the exterior of the resin package 63. These connecting terminals 64*a*, 64*b*, 64*c* are connected to each other within the resin package 63, and are electrically commonly connected to each other.

In the neutral diode 43P of the positive side, the cathode electrode of the diode chip 62 is arranged so as to be joined to the electrically conductive substrate 61, and the drawing-out terminal 64 is connected to the anode electrode of the diode chip 62. As its result, in the neutral diode 43P of the positive side, the electrically conductive substrate 61 constitutes a cathode terminal, and the connecting terminals 64*a*, 64*b*, 64*c* constitute anode terminals. In contrast to this, in the neutral diode 43N of the negative side, the anode electrode of the diode chip 62 is arranged so as to be joined to the electrically conductive substrate 61, and the drawing-out terminal 64 is joined to the cathode electrode of the diode chip 62. As its result, in the neutral diode 43N of the negative side, the electrically conductive substrate 61 constitutes an anode terminal, and the connecting terminals 64*a*, 64*b*, 64*c* constitute cathodes. In the heat sink 44 shown in FIG. 3, the electrically conductive substrate 51 of the positive side diode 43P, i.e., the cathode drawing-out terminal is joined to the heat sink 44, and its anode drawing-out terminal 54 is extended toward the negative side diode 43N. Further, in the heat sink 45, the electrically conductive substrate 51 of the negative side diode 43N, i.e., the anode drawing-out terminal is joined to the heat sink 45, and its cathode drawing-out terminal 54 is extended toward the positive side diode 42P.

Figure 6:
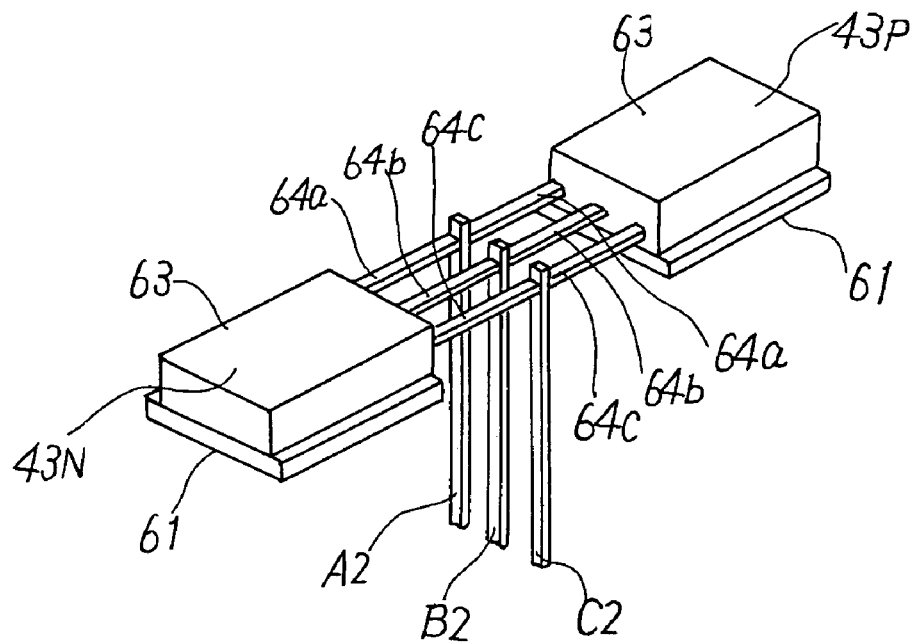
FIG. 6 is a perspective view showing the connecting structure of a neutral diode pair.

FIG. 6 is a perspective view showing the connecting structure of the positive side diode 43P and the negative side diode 43N constituting the neutral diode pair 41N, and the neutral side coil terminals A2, B2, C2 of the respective generating coils A, B, C. The connecting terminals 64*a*, 64*b*, 64*c* of the positive side diode 43P are extended toward the connecting terminals 64*a*, 64*b*, 64*c* of the negative side diode 43N in parallel with each other. Further, the connecting terminals 64*a*, 64*b*, 64*c* of the negative side diode 43N are extended toward the connecting terminals 64*a*, 64*b*, 64*c* of the positive side diode 43P in parallel with each other. As shown in FIG. 6, the first, second and third connecting terminals 64*a*, 64*b*, 64*c* of the diode 43P and the first, second and third connecting terminals 64*a*, 64*b*, 64*c* of the diode 43N are arranged such that their tips are butted to each other. The coil terminals A2, B2, C2 of the neutral side of the respective generating coils A, B, C are respectively nipped between the tips of the first, second and third connecting terminals 64*a*, 64*b*, 64*c* of the diode 43P and the tips of the first, second and third connecting terminals 64*a*, 64*b*, 64*c* of the diode 43N, and are brazed and fixed to each other in these nipped portions, and are electrically connected. The coil terminal A2 of the neutral side of the generating coil A is nipped between the tips of the respective first connecting terminals 64*a*, 64*a* of the diodes 43P and 43N, and is brazed. The coil terminal B2 of the neutral side of the generating coil B is nipped between the tips of the respective second connecting terminals 64*b*, 64*b* of the diodes 43P and 43N, and is brazed. Further, the coil terminal C2 of the neutral side of the generating coil C is nipped between the tips of the respective third connecting terminals 64*c*, 64*c* of the diodes 43P and 43N, and is brazed.

Explanation of Effects Obtained by First Embodiment

As mentioned above, the first embodiment relates to the three-phase alternating current electric generator for a vehicle in which the generating coils A, B, C of the three phases are connected in the Y-shape connection. The respective generating coils A, B, C are constructed so as to have the coil terminals A1, B1, C1 of the non-neutral side and the coil terminals A2, B2, C2 of the neutral side. Further, the rectifier assembly 40 has the neutral diodes 43P, 43N for making the neutral point connection. These neutral diodes 43P, 43N have the first, second and third connecting terminals 64*a*, 64*b*, 64*c* electrically commonly connected to each other. The coil terminal A2 of the neutral side of the generating coil A is connected to the first connecting terminal 64*a*. The coil terminal B2 of the neutral side of the generating coil B is connected to the second connecting terminal 64*b*. The coil terminal C2 of the neutral side of the generating coil C is connected to the third connecting terminal 64*c*. One coil terminal of the generating coils A, B, C is connected to each of the connecting terminals 64*a*, 64*b*, 64*c* by this connecting construction so that their connecting work can be easily made. Further, since it is not necessary to use a special circuit substrate as in the conventional case, the interior of the bracket of the electric generator can be simplified.

In the first embodiment, the neutral diodes 43P, 43N have the diode chip 62, the resin package 63 for sealing this diode chip 62, and the drawing-out terminal 64 drawn out from this resin package 63. The first, second and third connecting terminals 64*a*, 64*b*, 64*c* are formed in this drawing-out terminal 64. Accordingly, the connecting work of the diodes 43P, 43N and the coil terminals A2, B2, C2 of the neutral side of the generating coils A, B, C can be simplified by improving the drawing-out terminal 64.

In the first embodiment, the rectifier assembly 40 has the neutral diode 43P of the positive side and the neutral diode 43N of the negative side. In the neutral diode 43P of the positive side, the anode drawing-out terminal 64 connected to the anode of the diode chip 62 has the first, second and third connecting terminals 64*a*, 64*b*, 64*c*. In the neutral diode 43N of the negative side, the cathode drawing-out terminal 64 connected to the cathode of the diode chip 62 has the first, second and third connecting terminals 64*a*, 64*b*, 64*c*. Further, the coil terminal A2 of the neutral side of the generating coil A is connected to the first connecting terminal 64*a* of each of the anode drawing-out terminal 64 of the diode 43P of the positive side and the cathode drawing-out terminal 64 of the diode 43N of the negative side. The coil terminal B2 of the neutral side of the generating coil B is connected to the second connecting terminal 64*b* of each of the anode drawing-out terminal 64 of the diode 43P of the positive side and the cathode drawing-out terminal 64 of the diode 43N of the negative side. The coil terminal C2 of the neutral side of the generating coil C is connected to the third connecting terminal 64*c* of each of the anode drawing-out terminal 64 of the diode 43P of the positive side and the cathode drawing-out terminal 64 of the diode 43N of the negative side. As this result, while the connecting work of the coil terminal of the generating coil of each phase and the neutral diodes 43P, 43N is simplified, the alternating current output at the neutral point of each of the generating coils A, B, C can be rectified and the rectified output can be increased.

Further, in the first embodiment, the coil terminal A2 of the neutral side of the generating coil A is nipped and connected between the respective first connecting terminals 64a of the anode drawing-out terminal 64 of the neutral diode 43P of the positive side and the cathode drawing-out terminal 64 of the neutral diode 43N of the negative side. The coil terminal B2 of the neutral side of the generating coil B is nipped and connected between the respective second connecting terminals 64b of the anode drawing-out terminal 64 of the neutral diode 43P of the positive side and the cathode drawing-out terminal 64 of the neutral diode 43N of the negative side. Further, the coil terminal C2 of the neutral side of the generating coil C is nipped and connected between the respective third connecting terminals 64b of the anode drawing-out terminal 64 of the neutral diode 43P of the positive side and the cathode drawing-out terminal 64 of the neutral diode 43N of the negative side. As its result, while the connecting work of the coil terminal of the generating coil of each phase and the neutral diodes 43P, 43N is further simplified, the alternating current output at the neutral point of each of the generating coils A, B, C can be rectified and the rectified output can be increased.

Explanation of Second Embodiment

Figure 5:
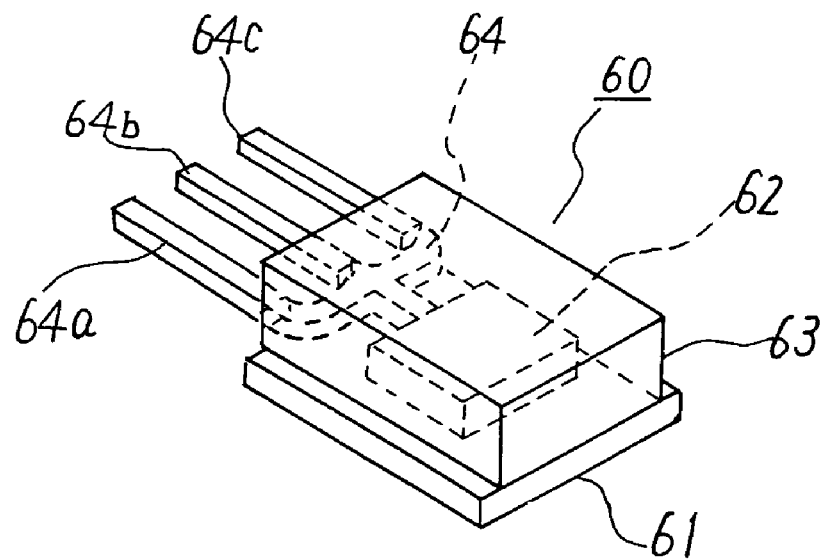
FIG. 5 is a perspective view showing a neutral diode used in the first embodiment.
Figure 7:
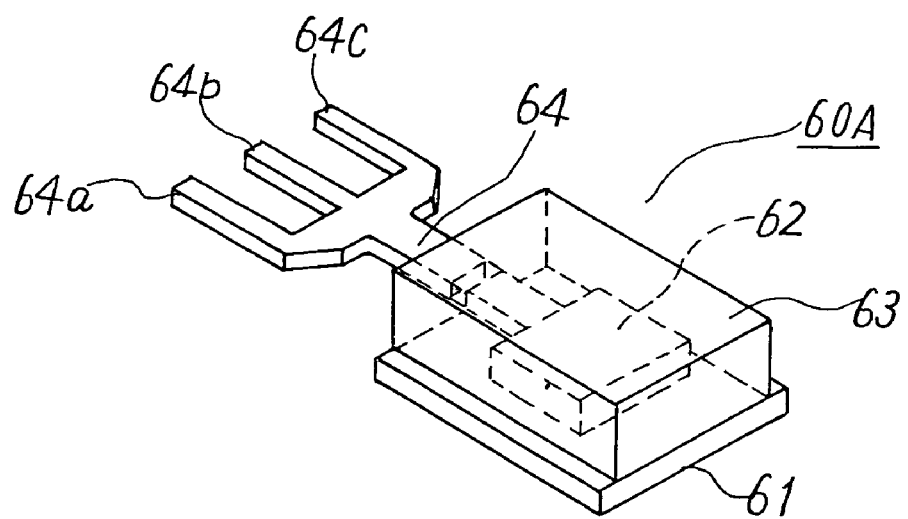
FIG. 7 is a perspective view showing a neutral diode used in a second embodiment of the three-phase alternating current electric generator for a vehicle in this invention.

In the first embodiment, the package structure 60 shown in FIG. 5 is adopted as the neutral diodes 43P, 43N. However, in the second embodiment, a package structure 60A shown in FIG. 7 is used as the package structure of the neutral diodes 43P, 43N. In this package structure 60A of FIG. 7, first, second and third connecting terminals 64a, 64b, 64c are electrically commonly connected to each other in the exterior of a resin package 63 with respect to the drawing-out terminal 64. The other constructions of the package structure 60A are the same as the package structure 60 of FIG. 5. This package structure 60A of FIG. 7 is also adopted in the neutral diode 43P of the positive side and the neutral diode 43N of the negative side. The anode and the cathode of the diode chip 62 are similarly arranged so as to be reverse to each other in the diodes 43P and 43N.

In accordance with this second embodiment, the same effects as the first embodiment can be obtained.

Explanation of Third Embodiment

Figure 8:
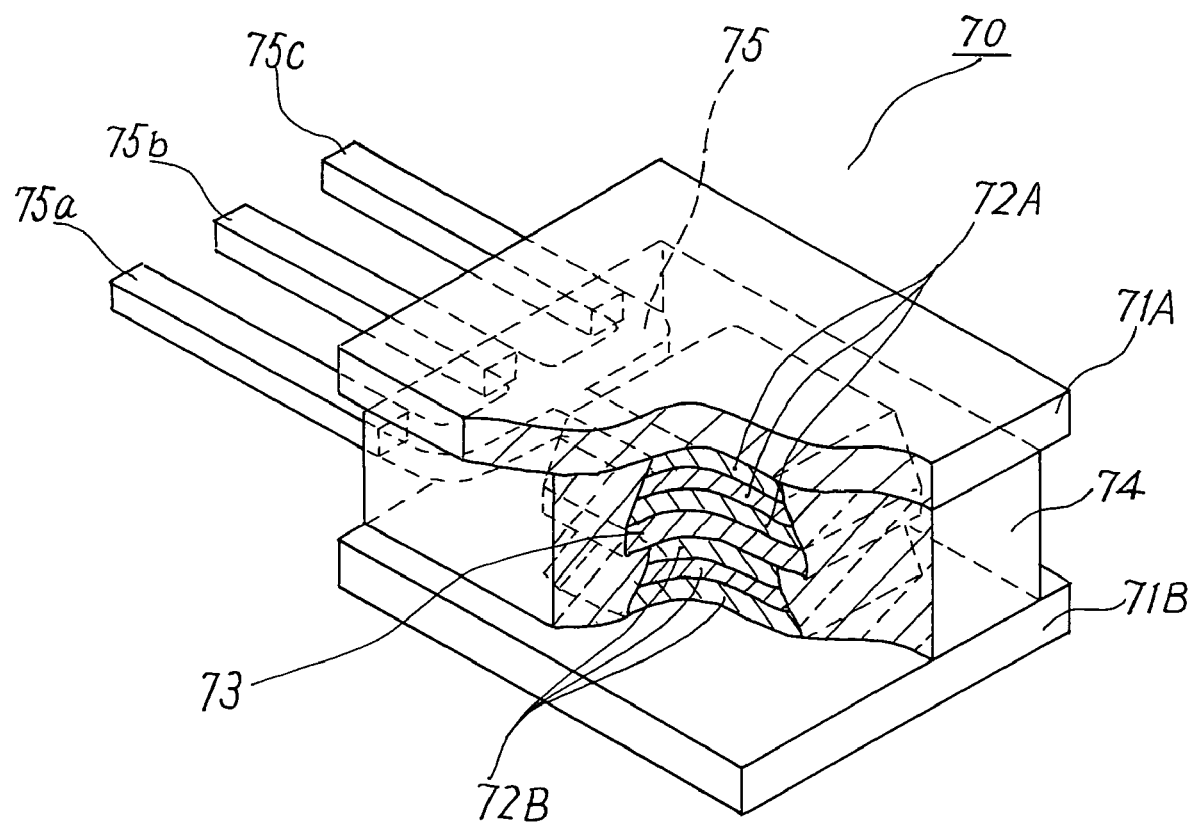
FIG. 8 is a perspective view showing a neutral diode used in a third embodiment of the three-phase alternating current electric generator for a vehicle in this invention.

In this third embodiment, a composite type neutral diode 70 having a package structure shown in FIG. 8 is used instead of the neutral diodes 43P, 43N of the first embodiment. This neutral diode 70 of FIG. 8 is a composite type diode constructed such that the neutral diode 43P of the positive side and the neutral diode 43N of the negative side in the first embodiment are stored into one package. A diode pair 41N for making the neutral point connection is constructed by this one composite type diode 70.

In this neutral diode 70, two diode chips 72A, 72B and an intermediate electrically conductive substrate 73 are nipped between a pair of electrically conductive substrates 71A, 71B opposed to each other. The intermediate electrically conductive substrate 73 is nipped so as to be located just in an intermediate position of the two diode chips 72A, 72B. The diode chip 72A is a diode chip of the positive side, and is arranged between the electrically conductive substrates 71A, 73 such that the cathode is joined to the electrically conductive substrate 71A and the anode is joined to the intermediate electrically conductive substrate 73. The diode chip 72B is a diode chip of the negative side, and is arranged between the electrically conductive substrates 73, 71B such that the cathode is joined to the intermediate electrically conductive substrate 73 and the anode is joined to the electrically conductive substrate 71B. The diode chips 72A, 72B are sealed by a resin package 74 together with the intermediate electrically conductive substrate 73. The electrically conductive substrates 71A, 71B are exposed from the resin package 74.

A drawing-out terminal 75 drawn out of the resin package 74 is integrally formed in the intermediate electrically conductive substrate 73. In this drawing-out terminal 75, three connecting terminals 75a, 75b, 75c extended in parallel with each other are formed in the exterior of the resin package 74. These connecting terminals 75a, 75b, 75c are electrically commonly connected to each other in the interior of the resin package 74. However, the connecting terminals 75a, 75b, 75c can be also electrically commonly connected to each other in the exterior of the resin package 74.

The coil terminal A2 of the neutral side of the generating coil A is connected to the first connecting terminal 75a. The coil terminal B2 of the neutral side of the generating coil B is connected to the second connecting terminal 75b. The coil terminal C2 of the neutral side of the generating coil C is connected to the third connecting terminal 75c.

The electrically conductive substrate 71B is joined to the heat sink 45 directly attached to the bracket 11. The electrically conductive substrate 71A is connected to the heat sink 44 insulated with respect to the bracket 11. If the composite type diode constructed by compounding a positive side diode chip and a negative side diode chip is also used in the diode pairs 41A, 41B, 41C, a three-phase alternating current electric generator for a vehicle having the same electric circuit as FIG. 1 can be constructed by arranging the two heat sinks 44, 45 so as to be opposed to e.g., the rotating shaft 13 in the axial direction and nipping diode pairs 41N, 41A, 41B, 41C constructed by the composite shape diode therebetween.

In this third embodiment, the same effects as the first embodiment can be obtained and the diode pairs 41A, 41B, 41C, 41N can be further made compacter.

Explanation of Fourth Embodiment

Figure 9:
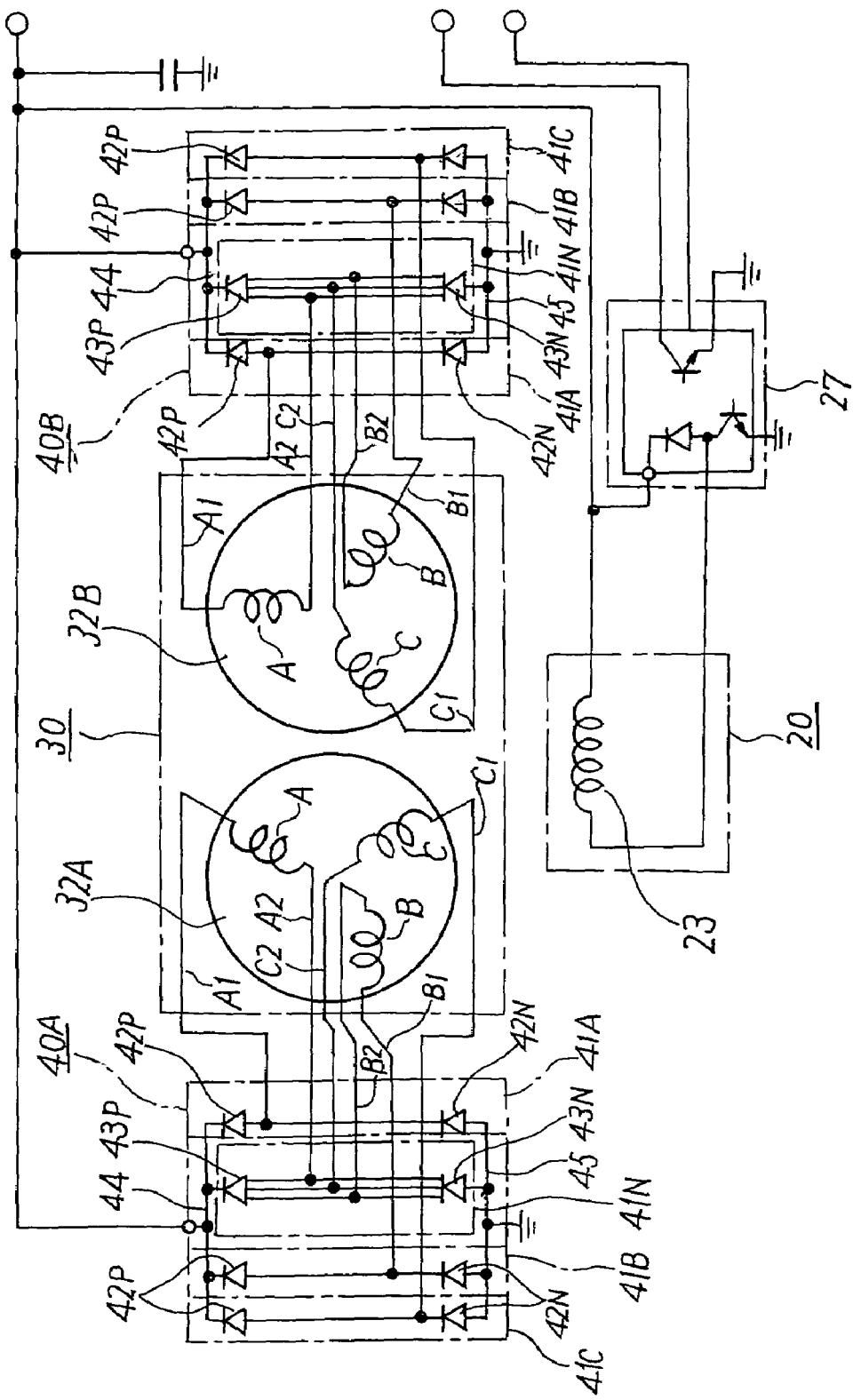
FIG. 9 is an electric circuit diagram showing a fourth embodiment of the three-phase alternating current electric generator for a vehicle in this invention.

FIG. 9 is an electric circuit diagram showing a fourth embodiment of a three-phase alternating current electric generator for a vehicle in this invention. In this fourth embodiment, two armature coils 32A, 32B are arranged in a stator 30. Each of these armature coils 32A, 32B has generating coils A, B, C of three phases connected in a Y-shape connection. Each of the respective armature coils 32A, 32B is wound around a common armature iron core 31, and is magnetized by a field magnetic coil 23 of a common rotor 20.

Two rectifier assemblies 40A, 40B are arranged correspondingly to the two armature coils 32A, 32B. The constructions of these rectifier assemblies 40A, 40B are respectively the same as the construction of the rectifier assembly 40 of the first embodiment. The rectifier assemblies 40A, 40B are electrically connected to each other in parallel, and are connected to an output terminal OT of the electric generator, and supply electricity to a common battery for a vehicle and an electric load.

In this fourth embodiment, the same effects as the first embodiment are obtained. In addition to this, electricity can be supplied to various kinds of loads for a vehicle in two systems using the two armature coils 32A, 32B and the two rectifier assemblies 40A, 40B.

Explanation of Fifth Embodiment

In all the above first to fourth embodiments, the three-phase alternating current electric generator for a vehicle for connecting the electricity generating coils A, B, C of three phases in the Y-shape connection is used. However, in the fifth embodiment, a three-phase alternating current electric generator for a vehicle of a type for connecting the electricity generating coils A, B, C of three phases in a Δ-shape connection is used.

Figure 10:
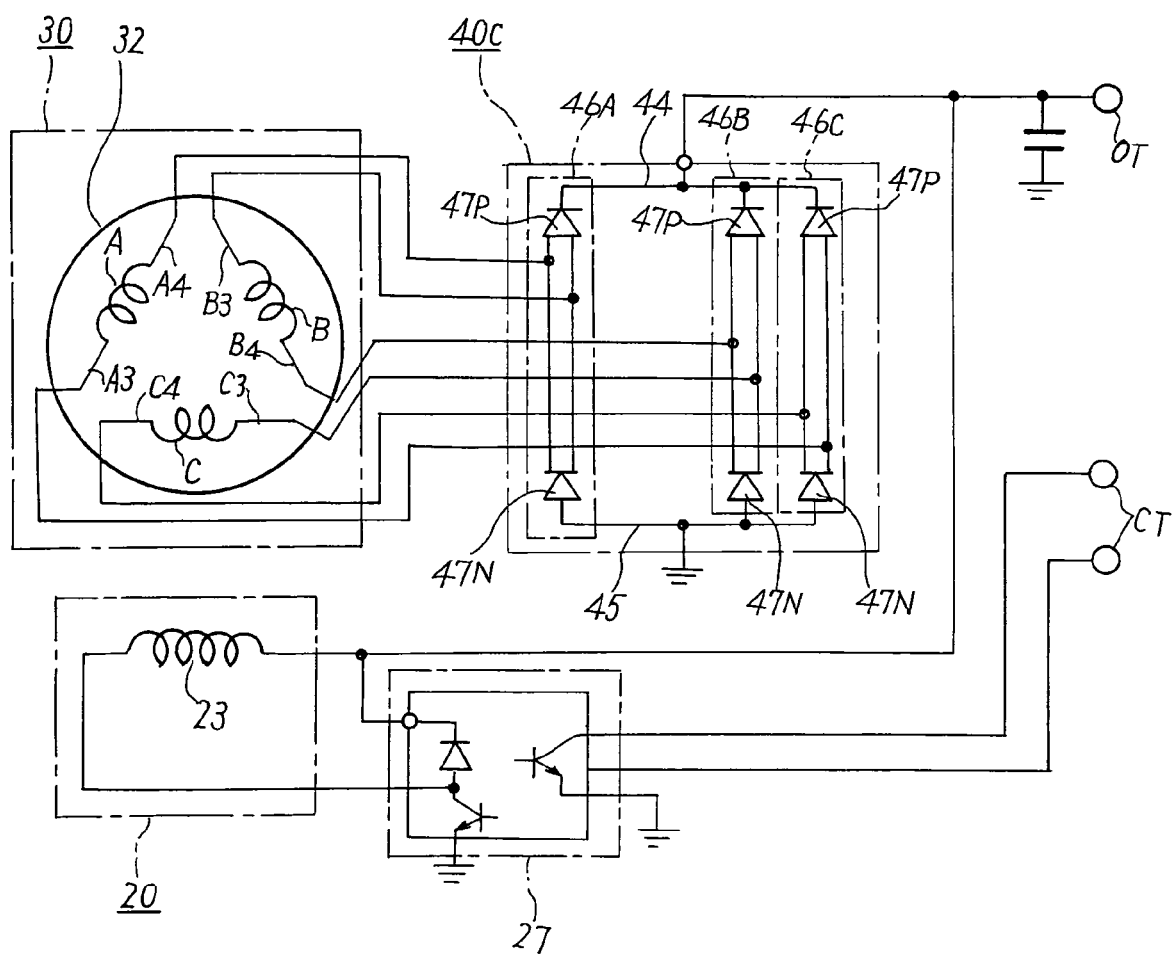
FIG. 10 is an electric circuit diagram showing a fifth embodiment of the three-phase alternating current electric generator for a vehicle in this invention.

FIG. 10 is an electric circuit diagram showing the fifth embodiment of the three-phase alternating current electric generator for a vehicle in this invention. In this fifth embodiment, similar to the first embodiment, an armature coil 32 of a stator 30 has the generating coils A, B, C of three phases, and each of these generating coils A, B, C is constructed so as to have two independent coil terminals. In this fifth embodiment, the generating coils A, B, C are respectively set to have first coil terminals A3, B3, C3 and second coil terminals A4, B4, C4.

A rectifier assembly 40C is combined with these generating coils A, B, C. This rectifier assembly 40C is also a three-phase full-wave rectifier, and the electricity generating coils A, B, C are connected in the Δ-shape connection. The rectifier assembly 40C rectifies the alternating current outputs of the generating coils A, B, C as three-phase full-waves. This rectifier assembly 40C has three diode pairs 46A, 46B, 46C. These diode pairs 46A, 46B, 46C are mutually equally constructed, and respectively have a diode 47P of the positive side and a diode 47N of the negative side.

Figure 11:
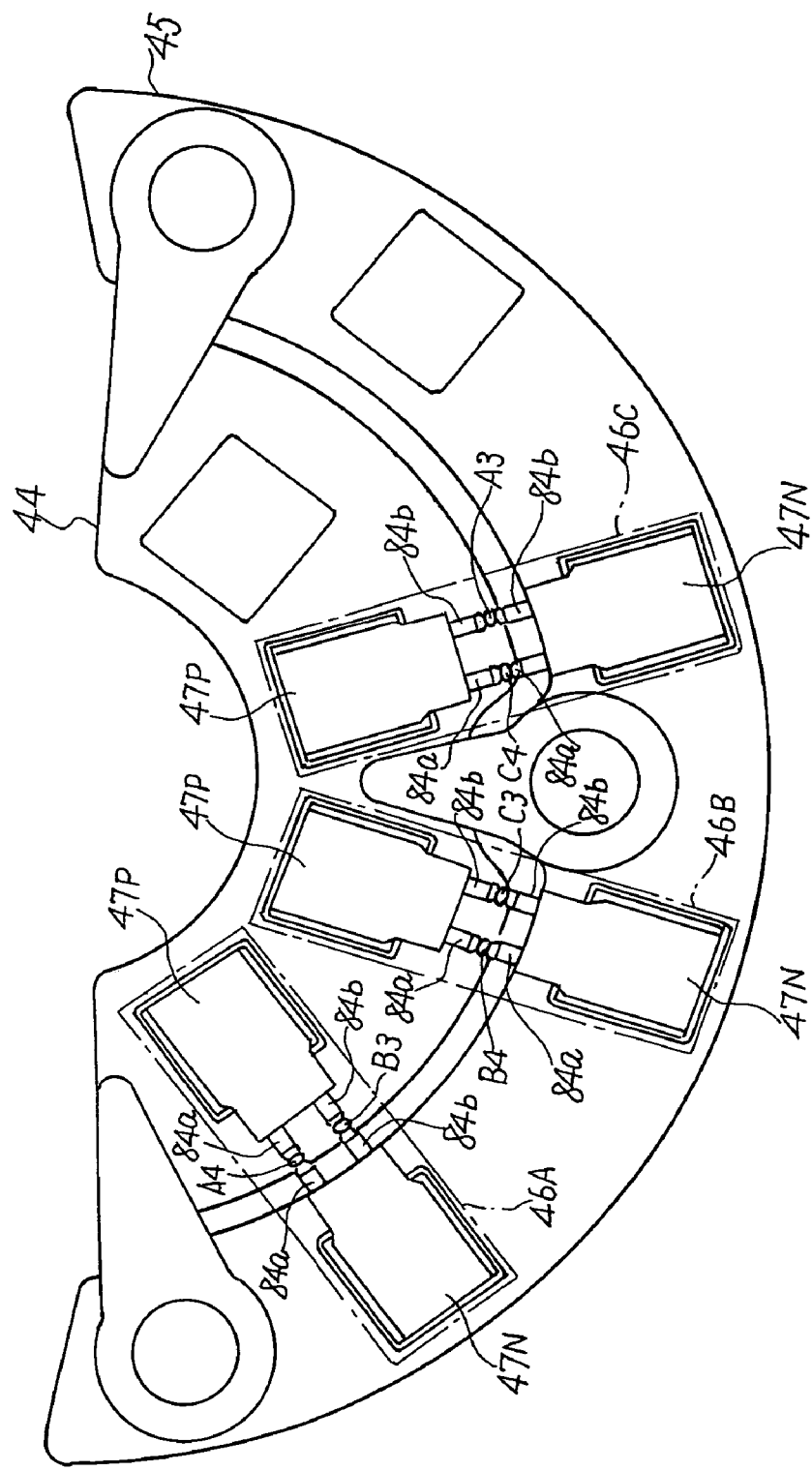
FIG. 11 is a front view showing a heat sink used in the fifth embodiment.

The rectifier assembly 40C has the same heat sinks 44, 45 as the first embodiment. FIG. 11 shows the heat sinks 44, 45 used in this fifth embodiment. The heat sink 44 of the positive side is arranged within the bracket 11 so as to be located in the inner circumference of the heat sink 45 of the negative side, and is attached to the bracket 11 so as to be electrically insulated from the bracket 11. The heat sink 45 is directly attached to the inner face of the bracket 11. Three diodes 47P of the positive side are arranged in the heat sink 44 at an equal angle interval. Three diodes 47N of the negative side are attached to the heat sink 45 at an equal angle interval so as to be opposed to the diodes 47P of the positive side.

Figure 12:
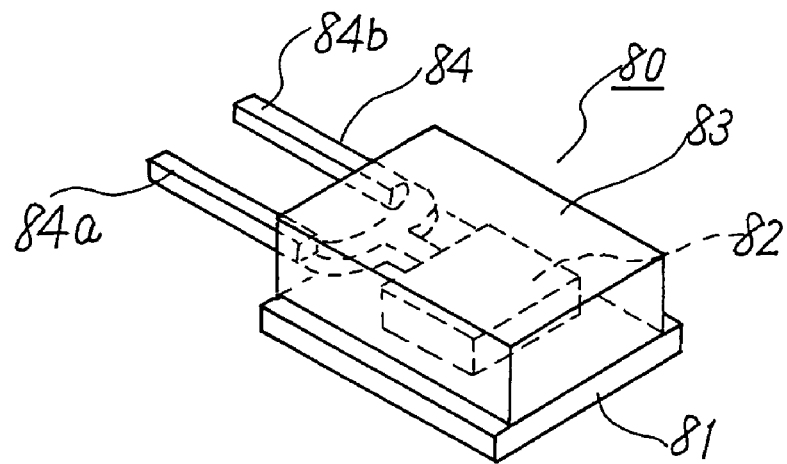
FIG. 12 is a perspective view showing a diode used in the fifth embodiment.

Diodes mutually having the same package structure 80 are used in the diodes 47P of the positive side and the diodes 47N of the negative side. This package structure 80 is shown in FIG. 12. This package structure 80 has an electrically conductive substrate 81, a diode chip 82 joined to this electrically conductive substrate 81, and a resin package 83 for sealing this diode chip 82, and a drawing-out terminal 84 drawn out from this resin package 83.

The diode chip 83 is arranged in the diode 47P of the positive side such that the cathode is joined to the electrically conductive substrate 81. The drawing-out terminal 84 is joined to the anode of the diode 47P of the positive side. As a result, in the diode 47P of the positive side, the electrically conductive substrate 81 constitutes a cathode terminal, and the drawing-out terminal 84 constitutes an anode terminal. The diode chip 83 is arranged in the diode 47N of the negative side such that the anode is joined to the electrically conductive substrate 81. The drawing-out terminal 84 is joined to the cathode of the diode 47N of the negative side. As a result, in the diode 47N of the negative side, the electrically conductive substrate 81 constitutes an anode terminal and the drawing-out terminal 84 constitutes a cathode terminal. In both the three diodes 47P of the positive side and the three diodes 47N of the negative side, their electrically conductive substrates 81 are brazed to the heat sinks 44, 45. Since the electrically conductive substrate 81 is a cathode terminal in the diode 47P of the positive side, the cathode terminals of the three diodes 47P of the positive side are joined to the heat sink 44 as a result. Further, since the electrically conductive substrate 81 is an anode in the diode 47N of the negative side, the anode terminals of the three diodes 47N of the negative side are joined to the heat sink 45 as a result.

The drawing-out terminal 84 of the package structure 80 has two connecting terminals 84a, 84b in the exterior of the resin package 83. These connecting terminals 84a, 84b are electrically commonly connected to each other within the resin package 83. In the diode 47P of the positive side, the drawing-out terminal 84 is an anode terminal. In the diode 47N of the negative side, the drawing-out terminal 84 is a cathode terminal. These diodes 47P, 47N are attached to the heat sinks 44, 45 such that the tips of the two connecting terminals 84a, 84b arranged in the respective drawing-out terminals 84 are opposed to each other.

In the diode pair 46A, the second coil terminal A4 of the generating coil A is connected between the respective first connecting terminals 84a of the diode 47P of the positive side and the diode 47N of the negative side. The first coil terminal B3 of the generating coil B is connected between the respective second connecting terminals 84b of these diodes 47P and 47N. Similarly, in the diode pair 46B, the second coil terminal B4 of the generating coil B is connected between the respective first connecting terminals 84a of the diodes 47P, 47N, and the first coil terminal C3 of the generating coil C is connected between the respective second connecting terminals 84b of these diodes 47P, 47N. Similarly, in the diode pair 46C, the second coil terminal C4 of the generating coil C is connected between the respective first connecting terminals 84a of the diodes 47P, 47N, and the first coil terminal A3 of the generating coil A is connected between the respective second connecting terminals 84b of the diodes 47P, 47N.

Figure 13:
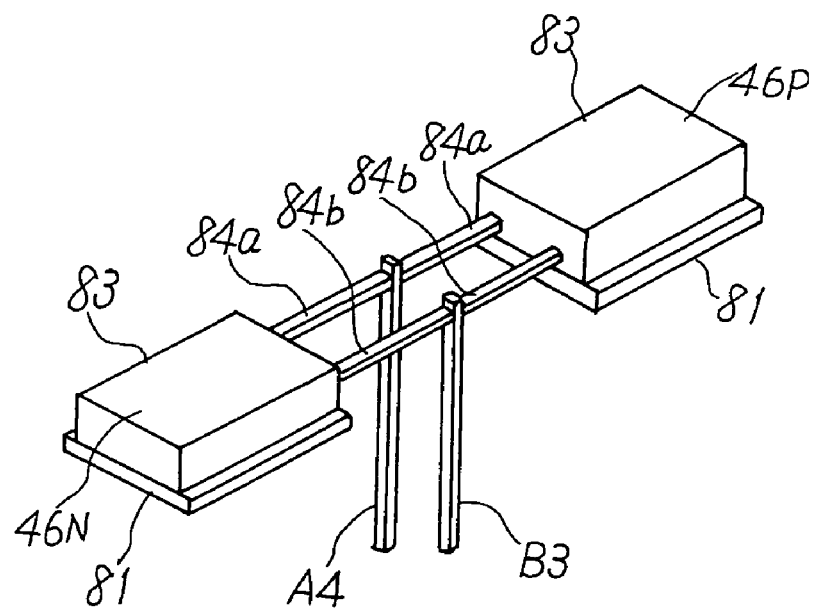
FIG. 13 is a perspective view showing the connecting structure of a diode pair of the fifth embodiment.

FIG. 13 shows the connecting structure of the diodes 47P, 47N and the coil terminals A4, B3 of the generating coils with the diode pair 46A as an example. In the respective first connecting terminals 84a of the diodes 47P, 47N, their tips are opposed to each other and the second coil terminal A4 of the generating coil A is nipped and brazed between these tips. In the respective second connecting terminals 84b of the diodes 47P, 47N, the respective tips are opposed to each other and the coil terminal B3 of the generating coil B is nipped and brazed between these tips. The other diode pairs 46B, 46C also have similar connecting structures. The generating coils A, B, C of three phases are connected in the Δ-shape connection by these connecting structures.

As mentioned above, in this fifth embodiment, the generating coils A, B, C are respectively constructed so as to have the first coil terminals A3, B3, C3 and the second coil terminals A4, B4, C4. The rectifier assembly 40C has the first, second and third diode pairs 46A, 46B, 46C, and these diode pairs 46A, 46B, 46C respectively have the first and second connecting terminals 84a, 84b electrically commonly connected to each other. In addition, the second coil terminal A4 of the generating coil A is connected to the first connecting terminal 84a of the first diode pair 46A, and the first coil terminal B3 of the generating coil B is connected to the second connecting terminal 84b of the first diode pair 46A. Further, the second coil terminal B4 of the generating coil B is connected to the first connecting terminal 84a of the second diode pair 46B, and the first coil terminal C3 of the generating coil C is connected to the second connecting terminal 84b of the second diode pair 46B. Further, the second coil terminal C4 of the generating coil C is connected to the first connecting terminal 84a of the third diode pair 46C, and the first coil terminal A3 of the generating coil A is connected to the second connecting terminal 84b of the third diode pair 46C. One coil terminal of the generating coils A, B, C is connected to the first and second connecting terminals 84a, 84b of each of the diode pairs 46A, 46B, 46C as a result by this connecting construction of the fifth embodiment, and their connecting work can be easily made. Further, since it is not necessary to use a special circuit substrate as in the conventional case, the interior of the bracket of the electric generator can be simplified.

Further, in the fifth embodiment, the diode 47P or 47N of the first, second and third diode pairs 46A, 46B, 46C respectively has the diode chip 82, the resin package 83 for sealing this diode chip 82, and the drawing-out terminal 84 drawn out of this resin package 84. The first and second connecting terminals 84a, 84b are formed in each of these drawing-out terminals 84. Accordingly, the connecting work of the respective coil terminals A3, A4, B3, B4, C3, C4 of the generating coils A, B, C and the diode 47P or 47N can be simplified by improving the drawing-out terminal 84.

Further, in the fifth embodiment, each of the diode pairs 46A, 46B, 46C has the positive side diode 47P and the negative side diode 47N. In the positive side diode 47P, the anode drawing-out terminal 84 has the first and second connecting terminals 84a, 84b electrically commonly connected to each other. In the negative side diode 47N, the cathode drawing-out terminal 84 has the first and second connecting terminals 84a, 84b electrically commonly connected to each other. In addition, in the first diode pair 46A, the first connecting terminal 84a of the anode drawing-out terminal 84 of the positive side diode 47P and the first connecting terminal 84a of the cathode drawing-out terminal 84 of the negative side diode 47N are connected together with the second coil terminal A4 of the electricity generating coil A. Further, the second connecting terminal 84b of the drawing-out terminal 84 of the positive side diode 47P and the second connecting terminal 84b of the drawing-out terminal 84 of the negative side diode 47N in the diode pair 46A are connected together with the first coil terminal B3 of the generating coil B. In the second diode pair 46B, the first connecting terminal 84a of the anode drawing-out terminal 84 of the positive side diode 47P and the first connecting terminal 84a of the cathode drawing-out terminal 84 of the negative side diode 47N are connected together with the second coil terminal B4 of the generating coil B. Further, the second connecting terminal 84b of the drawing-out terminal 84 of the positive side diode 47P and the second connecting terminal 84b of the drawing-out terminal 84 of the negative side diode 47N in the second diode pair 46B are connected together with the first coil terminal C3 of the generating coil C. In the third diode pair 46C, the first connecting terminal 84a of the anode drawing-out terminal 84 of the positive side diode 47P and the first connecting terminal 84a of the cathode drawing-out terminal 84 of the negative side diode 47N are connected together with the second coil terminal C4 of the generating coil C. Further, the second connecting terminal 84b of the drawing-out terminal 84 of the positive side diode 47P and the second connecting terminal 84b of the drawing-out terminal 84 of the negative side diode 47N in the third diode pair 46C are connected together with the first coil terminal A3 of the generating coil A. The respective generating coils A, B, C can be connected in the Δ-shape connection by this construction of the fifth embodiment while the connecting work of the coil terminals A3, A4, B3, B4, C3, C4 of the generating coils of the respective phases and the respective diodes 47P, 47N of the diode pairs 46A, 46B, 46C is simplified.

Further, in the fifth embodiment, in the first diode pair 46A, the second coil terminal A4 of the generating coil A is nipped and connected between the respective first connecting terminals 84a of the positive side diode 47P and the negative side diode 47N. Further, the first coil terminal B3 of the generating coil B is nipped and connected between the respective second connecting terminals 84b of the positive side diode 47P and the negative side diode 47N in the first diode pair 46A. In the second diode pair 46B, the second coil terminal B4 of the generating coil B is nipped and connected between the respective first connecting terminals 84a of the positive side diode 47P and the negative side diode 47N. Further, the first coil terminal C3 of the generating coil C is nipped and connected between the respective second connecting terminals 84b of the positive side diode 47P and the negative side diode 47N in the second diode pair 46B. In the third diode pair 46C, the second coil terminal C4 of the generating coil C is nipped and connected between the respective first connecting terminals 84a of the positive side diode 47P and the negative side diode 47N. Further, the first coil terminal A3 of the generating coil A is nipped and connected between the respective second connecting terminals 84b of the positive side diode 47P and the negative side diode 47N in the third diode pair 46C. The respective generating coils A, B, C can be connected in the Δ-shape connection by this connecting construction while the connecting work of the coil terminals A3, A4, B3, B4, C3, C4 of the generating coils of the respective phases and the respective diodes 47P, 47N of the diode pairs 46A, 46B, 46C is further simplified.

Explanation of Sixth Embodiment

Figure 14:
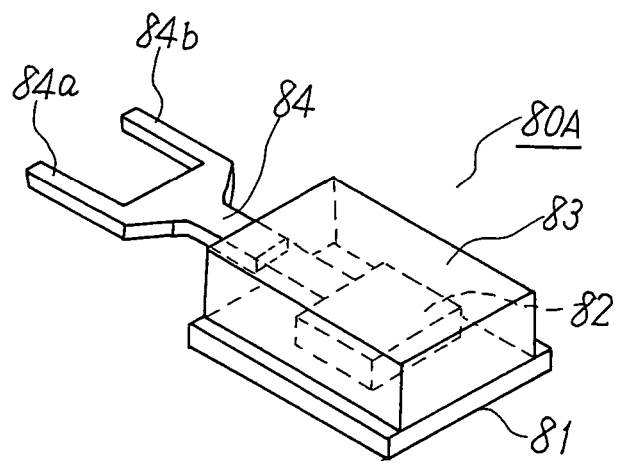
FIG. 14 is a perspective view showing a diode used in a sixth embodiment of the three-phase alternating current electric generator for a vehicle in this invention.

In the fifth embodiment, the package structure 80 shown in FIG. 12 is adopted as the diodes 47P, 47N. However, in the sixth embodiment, the package structure 80A shown in FIG. 14 is used as the package structures of the diodes 47P, 47N. In this package structure 80A of FIG. 14, the first and second connecting terminals 84a, 84b are electrically commonly connected to each other in the exterior of the resin package 83 with respect to the drawing-out terminal 84. The other constructions of the package structure 80A are the same as the package structure 80 of FIG. 12. This package structure 80A of FIG. 14 is also adopted in the positive side diode 47P and the negative side diode 47N. In the diodes 47P and 47N, the anode and the cathode of the diode chip 82 are similarly arranged so as to be reverse to each other.

In accordance with this sixth embodiment, the same effects as the fifth embodiment can be obtained.

Explanation of Seventh Embodiment

Figure 15:
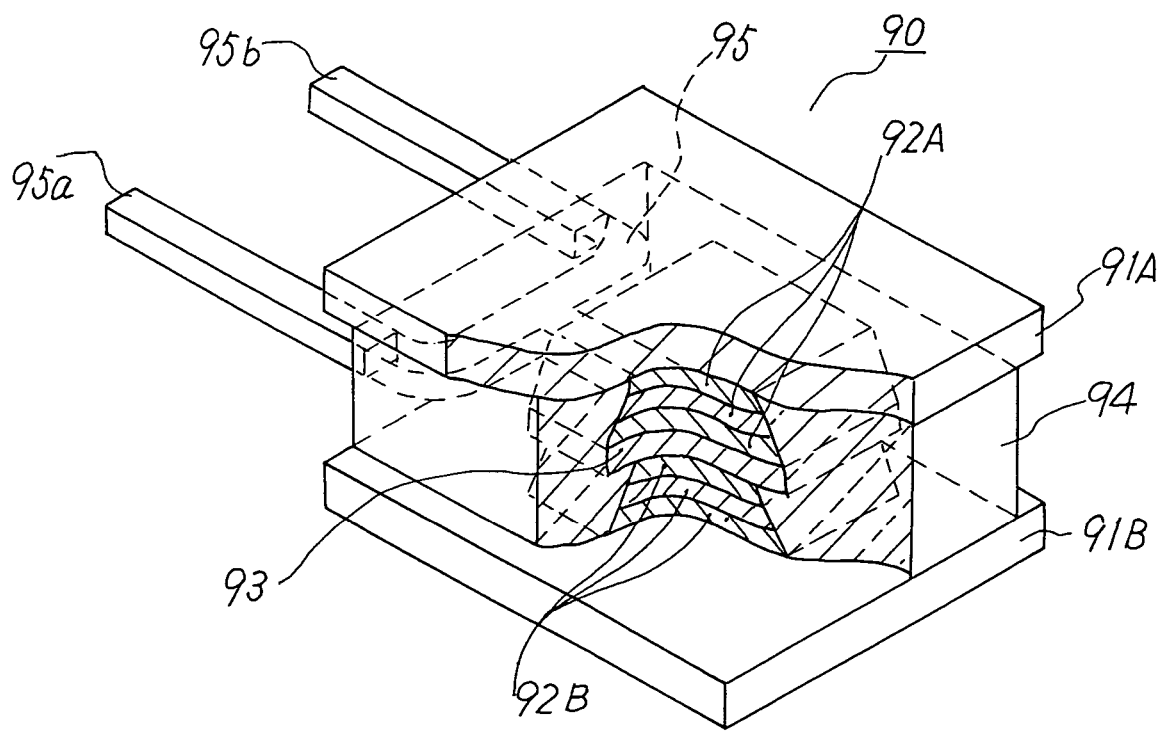
FIG. 15 is a perspective view showing the diode used in the three-phase alternating current electric generator for a vehicle in this invention.

This seventh embodiment uses a composite type diode 90 having the package structure shown in FIG. 15 instead of the diodes 47P, 47N of the fifth embodiment. This diode 90 of FIG. 15 is a composite type diode constructed such that one positive side diode 47P and one negative side diode 47N of the fifth embodiment are stored to one package. Since one diode pair is constructed by this one composite type diode 90, three diode pairs 46A, 46B, 46C are constructed by using three composite type diodes 90 in total.

In this composite type diode 90, two diode chips 92A, 92B and an intermediate electrically conductive substrate 93 are nipped between a pair of electrically conductive substrates 91A, 91B opposed to each other. The intermediate electrically conductive substrate 93 is nipped so as to be located just in an intermediate position of the two diode chips 92A, 92B. The diode chip 92A is a diode chip of the positive side, and is arranged between the electrically conductive substrates 91A, 93 such that the cathode is joined to the electrically conductive substrate 91A and the anode is joined to the intermediate electrically conductive substrate 93. The diode chip 92B is a diode chip of the negative side, and is arranged between the electrically conductive substrates 93, 91B such that the cathode is joined to the intermediate electrically conductive substrate 93 and the anode is joined to the electrically conductive substrate 91B. The diode chips 92A, 92B are sealed by a resin package 94 together with the intermediate electrically conductive substrate 93. The electrically conductive substrates 91A, 91B are exposed from the resin package 94.

A drawing-out terminal 95 drawn out of the resin package 94 is integrally formed in the intermediate electrically conductive substrate 93. In this drawing-out terminal 95, two connecting terminals 95a, 95b extended in parallel with each other are formed in the exterior of the resin package 94. These connecting terminals 95a, 95b are electrically commonly connected to each other in the interior of the resin package 94. However, the connecting terminals 95a, 95b can be also electrically commonly connected to each other in the exterior of the resin package 94.

In the first diode pair 46A, the second coil terminal A4 of the generating coil A is connected to the first connecting terminal 95a of the composite type diode 90, and the first coil terminal B3 of the generating coil B is connected to the second connecting terminal 95b of the composite type diode 90. Similarly, in the second diode pair 46B, the second coil terminal B4 of the generating coil B is connected to the first connecting terminal 95a of the composite type diode 90, and the first coil terminal C3 of the generating coil C is connected to the second connecting terminal 95b of the composite type diode 90. Similarly, in the third diode pair 46C, the second coil terminal C4 of the generating coil C is connected to the first connecting terminal 95a of the composite type diode 90, and the first coil terminal A3 of the generating coil A is connected to the second connecting terminal 95b of the composite type diode 90.

The electrically conductive substrate 91B is joined to the heat sink 45 directly attached to the bracket 11, and the electrically conductive substrate 91A is connected to the heat sink 44 insulated with respect to the bracket 11. If the composite type diode 90 is used in each of the three diode pairs 46A, 46B, 46C, a three-phase alternating current electric generator for a vehicle having the same electric circuit as FIG. 1 can be constructed by arranging the two heat sinks 44, 45 so as to be opposed to e.g., the rotating shaft 13 in the axial direction, and nipping the diode pairs 46A, 46B, 46C constructed by the composite type diode 90 between these heat sinks 44, 45.

In this seventh embodiment, the same effects as the fifth embodiment can be obtained, and the diode pairs 46A, 46B, 46C can be further made compacter.

INDUSTRIAL APPLICABILITY

The three-phase alternating current electric generator for a vehicle in this invention is mounted to various kinds of vehicles such as an automobile, a truck, etc., and is used to charge a battery for a vehicle and supply electricity to other loads for a vehicle.

The invention claimed is:

1. A three-phase alternating current electric generator for a vehicle comprising:
    an A-phase generating coil, a B-phase generating coil and a C-phase generating coil, the A-phase, B-phase and C-phase generating coils are connected in Y-shape connection to each other; and
    a rectifier assembly for rectifying alternating current outputs of the A-phase, B-phase and C-phase generating coils,
    wherein each of the A-phase, B-phase and C-phase generating coils comprises a non neutral side coil terminal and a neutral side coil terminal, and the rectifier assembly comprises a neutral diode for making neutral point connection, and the neutral diode comprises a diode chip, a package for sealing the diode chip and a drawing-out terminal drawn out from the package, the drawing-out terminal comprises a first, second and third connecting terminals commonly connected to each other, and the neutral side coil terminal of the A-phase generating coil is connected to the first connecting terminal, and the neutral side coil terminal of the B-phase generating coil is connected to the second connecting terminal, and the neutral side coil terminal of the C-phase generating coil is connected to the third connecting terminal.

2. The three-phase alternating current electric generator for a vehicle according to claim 1, wherein the rectifier assembly further comprises a positive side neutral diode and a negative side neutral diode, and the positive side neutral diode comprises a positive side diode chip and an anode drawing-out terminal connected to an anode of the positive side diode chip, the anode drawing-out terminal comprises a first, second and third connecting terminals commonly connected to each other, and the negative side neutral diode comprises a negative side diode chip and a cathode drawing-out terminal connected to a cathode of the negative side diode chip, the cathode drawing-out terminal comprises a first, second and third connecting terminals commonly connected to each other, and the neutral side coil terminal of the A-phase generating coil is connected to each of the first connecting terminals of the anode drawing-out terminal and the cathode drawing-out terminal, and the neutral side coil terminal of the B-phase generating coil is connected to each of the second connecting terminals of the anode drawing-out terminal and the cathode drawing-out terminal, and the neutral side coil terminal of the C-phase generating coil is connected to each of the third connecting terminals of the anode drawing-out terminal and the cathode drawing-out terminal.

3. The three-phase alternating current electric generator for a vehicle according to claim 2, wherein the neutral side coil terminal of the A-phase generating coil is nipped and connected between the respective first connecting terminals of the anode drawing-out terminal and the cathode drawing-out terminal, and the neutral side coil terminal of the B-phase generating coil is nipped and connected between the respective second connecting terminals of the anode drawing-out terminal and the cathode drawing-out terminal, and the neutral side coil terminal of the C-phase generating coil is nipped and connected between the respective third connecting terminals of the anode drawing-out terminal and the cathode drawing-out terminal.

4. The three-phase alternating current electric generator for a vehicle according to claim 1, wherein the neutral diode further comprises two diode chips sealed by the package, and the drawing-out terminal is connected to the anode of one diode chip among the two diode chips and the cathode of the other diode chip.

* * * * *